(12) United States Patent
Skurnik (10) Patent No.: US 8,269,172 B2
(45) Date of Patent: Sep. 18, 2012

(54) DOUBLE LAYER PHOTODIODES IN AMBIENT LIGHT SENSORS AND PROXIMITY DETECTORS

(75) Inventor: David Skurnik, Kirkland, WA (US)

(73) Assignee: Maxim Integrated Products, Inc., San Jose, CA (US)

( * ) Notice: Subject to any disclaimer, the term of this patent is extended or adjusted under 35 U.S.C. 154(b) by 176 days.

(21) Appl. No.: 12/889,335

(22) Filed: Sep. 23, 2010

(65) Prior Publication Data

US 2012/0074322 A1  Mar. 29, 2012

(51) Int. Cl.
*G01J 5/02* (2006.01)
(52) U.S. Cl. .................................. 250/339.05; 250/226
(58) Field of Classification Search .................. 250/226, 250/338.1, 339.01, 339.05, 339.11
See application file for complete search history.

(56) References Cited

U.S. PATENT DOCUMENTS

2011/0042556 A1\* 2/2011 Natsuaki ....................... 250/226

\* cited by examiner

*Primary Examiner* — Mark R Gaworecki
(74) *Attorney, Agent, or Firm* — North Weber & Baugh LLP (57) ABSTRACT

Embodiments of the present invention provide systems, devices and methods for detecting both ambient light and proximity to an object. This detection is performed by a double-layered photodiode array and corresponding circuitry such that ambient light and proximity detection are enabled by a plurality of integrated photodiodes. In various embodiments of the invention, ambient light is sensed using a first set of photodiodes and a second set of photodiodes such that a spectral response is created that is approximately equal to the visible light spectrum. Proximity detection is realized using an integrated photodiode, positioned below the first and second sets of photodiodes, that detects infrared light and generates a response thereto.

20 Claims, 13 Drawing Sheets

DOUBLE LAYER PHOTODIODES IN AMBIENT LIGHT SENSORS AND PROXIMITY DETECTORS

BACKGROUND

A. Technical Field

The present invention relates generally to ambient light sensing and proximity detection, and more particularly, to a double-layered ambient light sensor and proximity detector photodiode array having improved ambient light sensing and infrared sensitivity.

B. Background of the Invention

The importance of ambient light sensing and proximity detection is well understood by one of skill in the art. Both technologies have particular applicability to the mobile electronics market in that effective ambient light sensors and proximity detection allow a mobile device to properly manage power consumption and extend battery life. Typically, an ambient light sensor and a proximity detector operate in different wavelength bands and differ structurally within an integrated sensor array.

An ambient light sensor determines the intensity of visible light within the environment surrounding the sensor. In particular, the ambient light sensor provides a response to the amount of visible light (typically a narrow band of wavelengths centered around 550 nm) being detected within an environment. These sensors are oftentimes used in mobile devices to detect the amount of light present in the environment in which the device is being used. Based on this detection, the brightness or intensity of the display on the mobile device may be adjusted to provide an optimal intensity to the user while also properly managing power consumed by the display. One skilled in the art will recognize that there are many other applications for an ambient light detector.

Figure 1A:
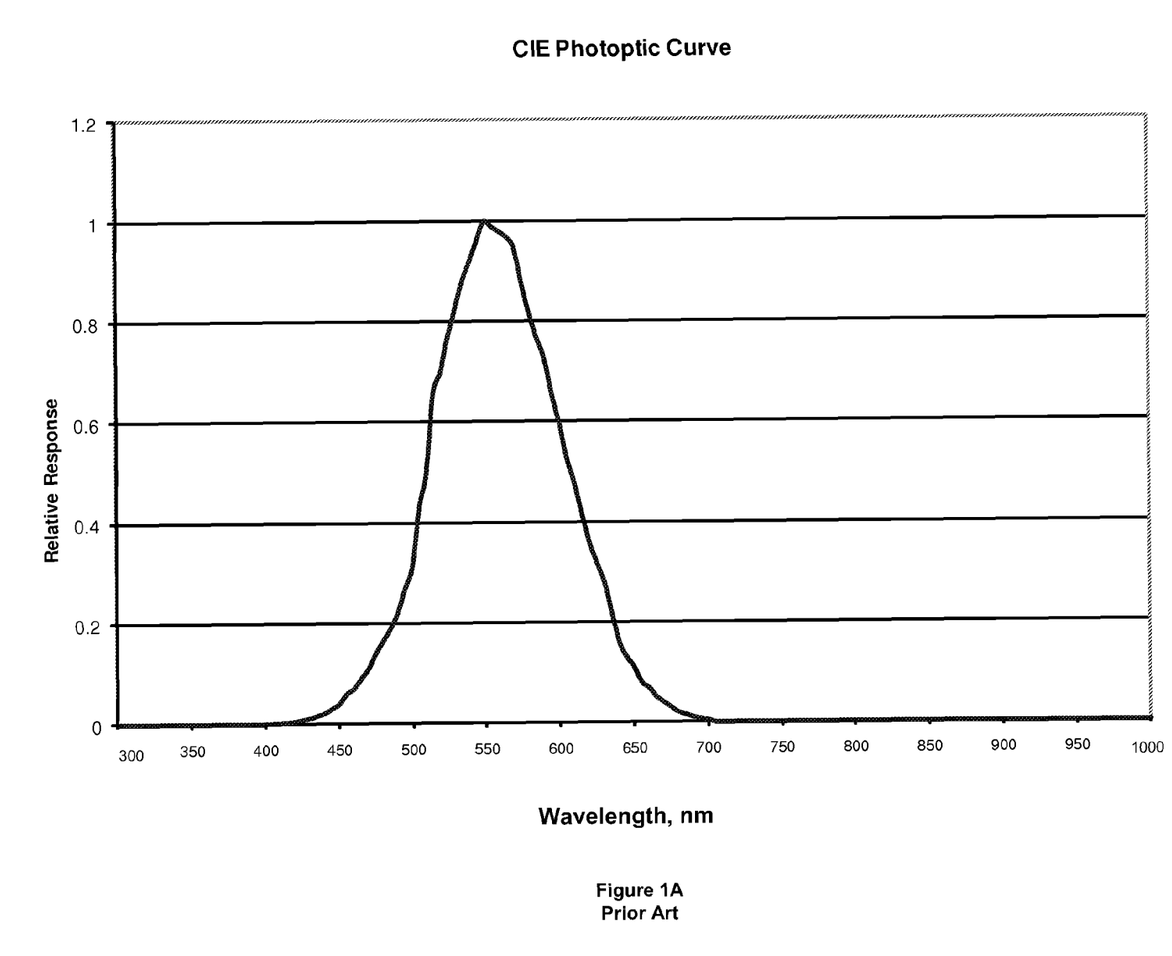

FIG. 1A shows a curve that is commonly known as the CIE photoptic curve. This curve represents the relative spectral response of the human eye. It can be seen that the human eye is not sensitive to wavelengths below 400 nm or above 700 nm. It is desirable that the ambient light sensor provides a spectral response that matches this curve as closely as possible.

Figure 1B:
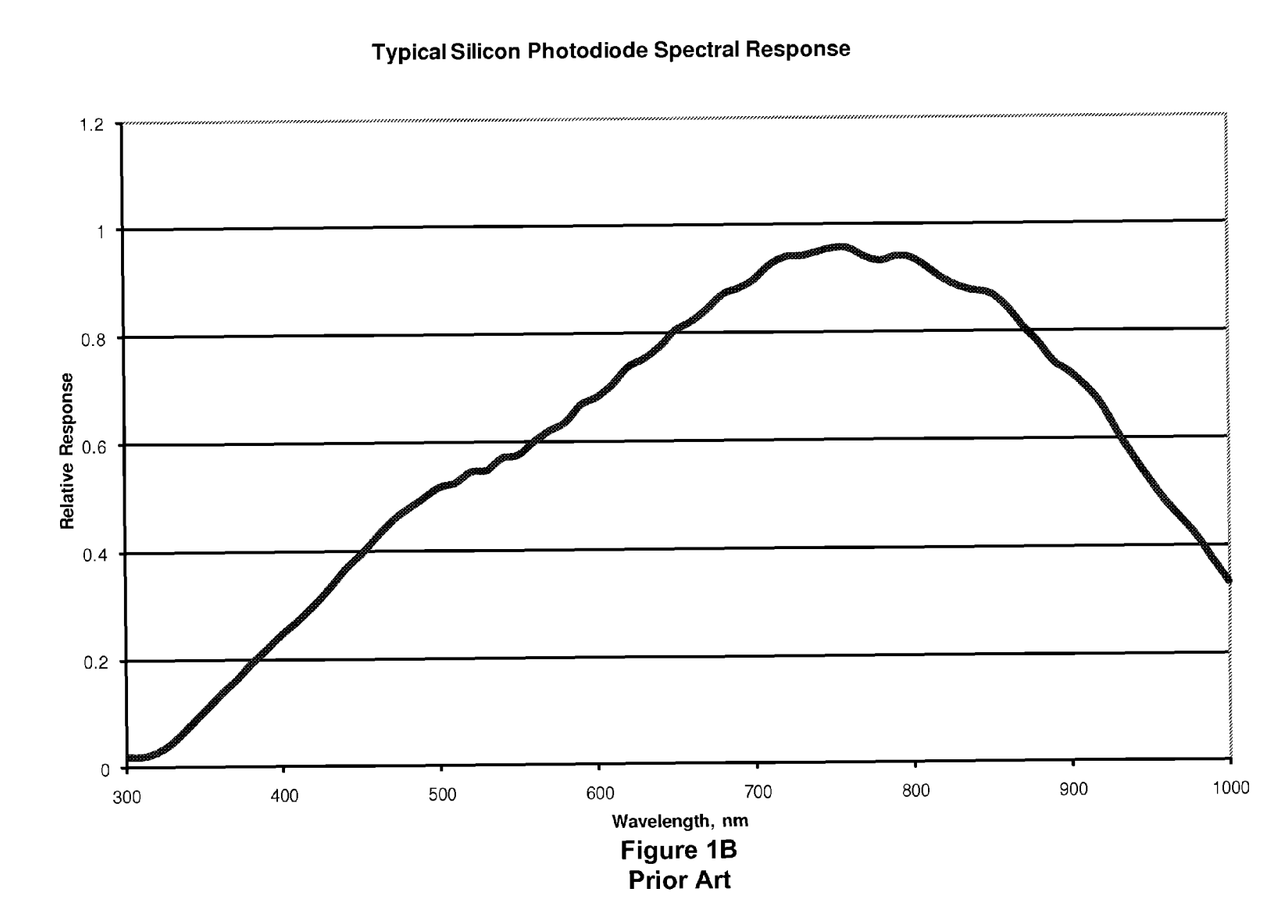
FIG. 1B is a typically silicon photodiode spectral response plot known to one of skill in the art.

FIG. 1B shows a curve that represents the spectral response of a typical silicon photodiode within the prior art. It can be seen that the silicon photodiode is responsive to wavelengths starting at 300 nm, and extending to above 1000 nm. The peak responsivity is in the region around 800 nm. Comparing FIGS. 1A and 1B, it is evident that an un-modified silicon photodiode cannot be used as an accurate ambient light sensor because it is sensitive to wavelengths of light outside the range of human vision. The mismatch between the two curves is most evident in the infrared region between 700 nm and 900 nm because while the human eye is not responsive to wavelengths beyond 700 nm, the silicon photodiode is very responsive in this region. It is well known that almost all natural and artificial light sources contain varying amounts of infrared radiation in the range of 700 nm to 1000 nm. In particular, light from incandescent light bulbs and also from the sun contains substantial quantities of infrared radiation. Although humans can feel this radiation in the form of heat, they cannot see it. Consequently, in order to use the common silicon photodiode as an accurate ambient light sensor, it is necessary to modify its responsivity to more closely match the human eye response.

Figure 1C:
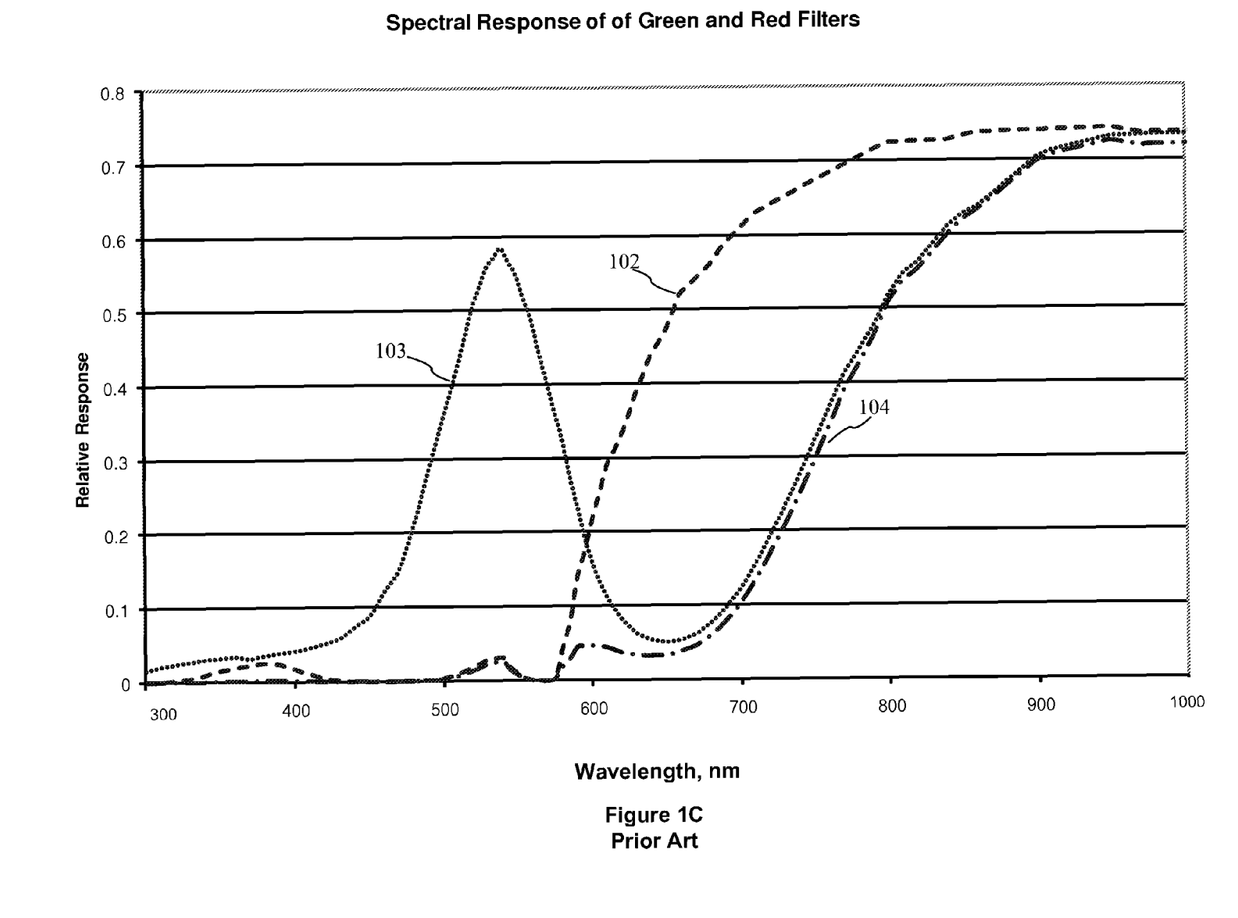
FIG. 1C illustrates example plots of the spectral response of green, red and green plus red filters.
Figure 1D:
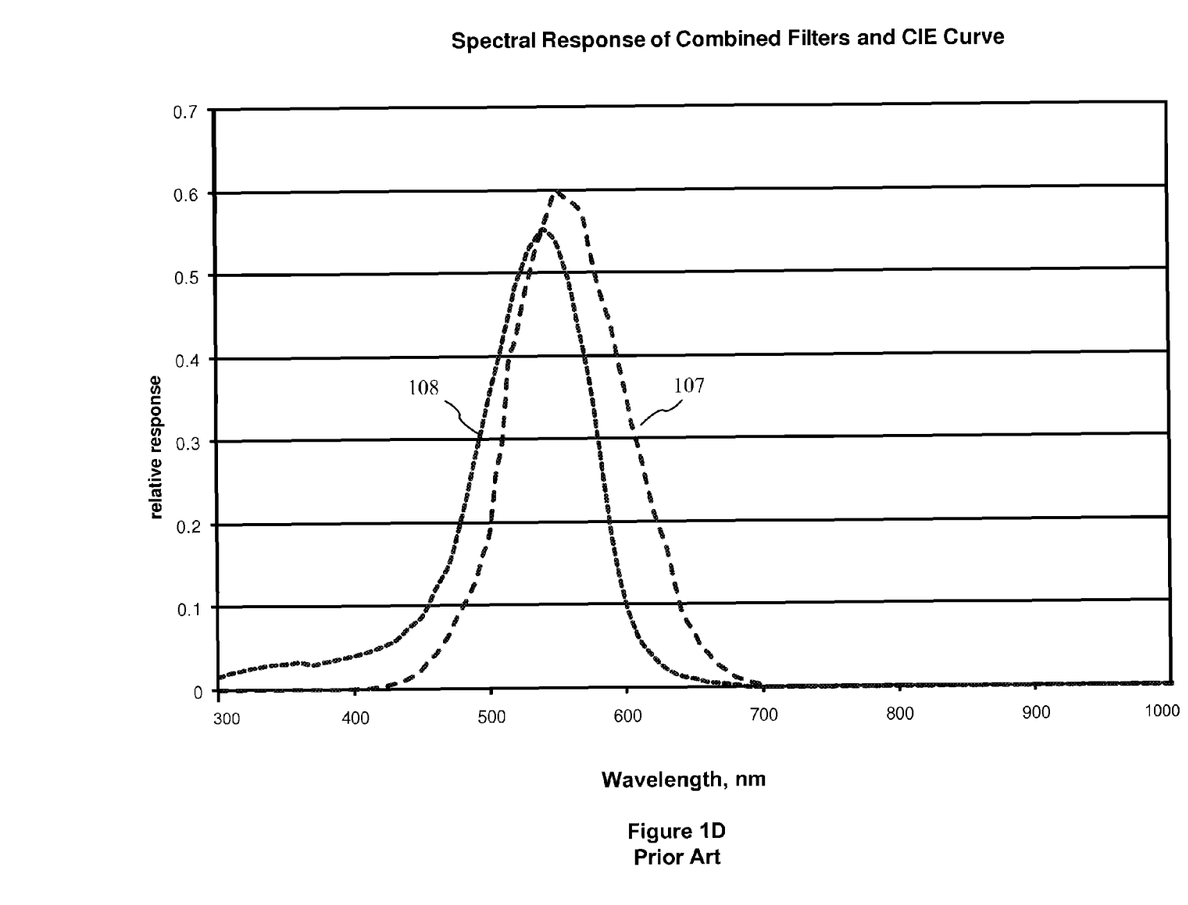
FIG. 1D illustrates an example of a spectral response using green and green+red photodiodes correlating to the visible light spectrum and the CIE photoptic curve.

The most common and economical method employed to modify the spectral response of a silicon photodiode is to apply color filters on the surface of the photodiode. FIG. 1C shows the spectral response of a typical red filter 102, a typical green filter 103, and the combined response of the green filter applied on top of the red filter 104. A further refinement to this practice is to divide the ambient light sensing photodiodes into two equal, but separate parts. The green filter is applied to one part, and the combination of the green plus red filter is applied to the other part. The respective signals from these two photodiodes can be scaled and then electronically subtracted from each other to produce the curve shown in FIG. 1D which also includes a copy of the CIE curve for reference. It can be seen that the response of the electronically processed signal, G−(G+R) 108 is a close approximation to the desired CIE curve 107.

An optical proximity detector determines the presence or absence of a reflective target within a certain range of the sensor. The intended target can be any object that reflects light. These proximity detectors operate by emitting light, either pulsed or continuous, and then sensing the light reflected from the target. Among other applications, proximity sensors are used within mobile phone devices to detect a handset being placed next to an ear or face. During this period in which a user is on the telephone, power to the device screen and/or other applications may be reduced in order to conserve battery power. One skilled in the art will recognize that there are many other applications for a proximity detector.

Proximity detectors typically employ infrared emitting light sources as the light emitter. There are several reasons for this choice, among them the abundant availability of high performance LED light sources at the infrared wavelengths near 850 nm and 940 nm, the high sensitivity of silicon photo detectors in this wavelength region, and the desire for the proximity detect function to be invisible, and therefore undetectable by the user.

The reflectivity of the target can be extremely variable because of the unknown characteristics of the target. For example, in order to detect the proximity of a mobile telephone handset to the user's face, the proximity detector must be able to operate correctly with reflections from dark hair, light hair, dark clothing such as hats or scarves, and also bare skin with or without facial hair. This wide variation of reflectivity demands a very sensitive detector.

Figure 1E:
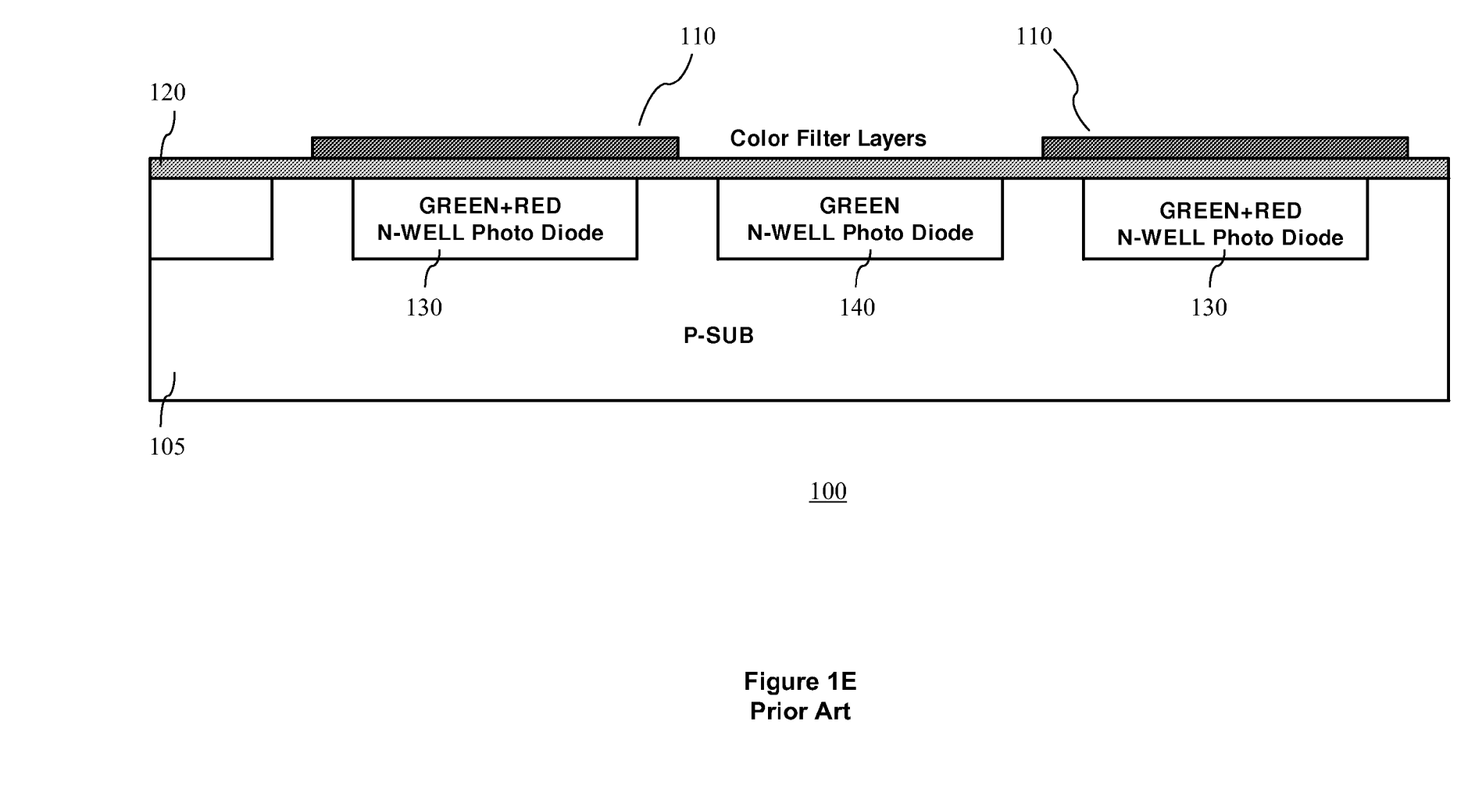
FIG. 1E is an example of a pixilated photodiode array commonly used in the prior art.

FIG. 1E illustrates an array of photodiodes 100 that provides both ambient light sensing and proximity detection commonly found within the prior art. The array comprises a P-type substrate 105 on which N-well photodiodes are constructed. In order to shape the response of the photodiodes, as described previously, a color filter layer or layers is placed over each of the photodiodes. A green filter 120 is placed on top of each of the N-well photodiodes and a red filter 110 (in addition to the green filter) is placed only on particular photodiodes. Typically, the number of photodiodes that receive both layers is equal to the number that receives only the green layer. A first set of these photodiodes operates as green and red N-well photodiodes 130 and a second set of these photodiodes operates as green N-well photodiodes 140.

The array shown in FIG. 1E performs ambient light sensing and proximity detection. The ambient light sensing function produces a spectral curve matching the CIE curve of FIG. 1A. As described previously, one of the important characteristics of the ambient light sensing function is the ability to suppress the otherwise strong sensitivity to infrared light. This function is performed by executing the mathematical operation G−(G+R) as previously described. The proximity detect function, however, has a much different requirement. It must have high infrared sensitivity in order to sense the presence or absence of a light at the infrared wavelengths of 850 nm or 940 nm. These two functions place opposite burdens on the photo sensor with respect to infrared detection—one function requires suppression of infrared, while the other function requires enhancement of infrared reception. It is difficult to satisfy these two conflicting demands in one sensor, and in practice a compromise is typically employed.

Figure 2:
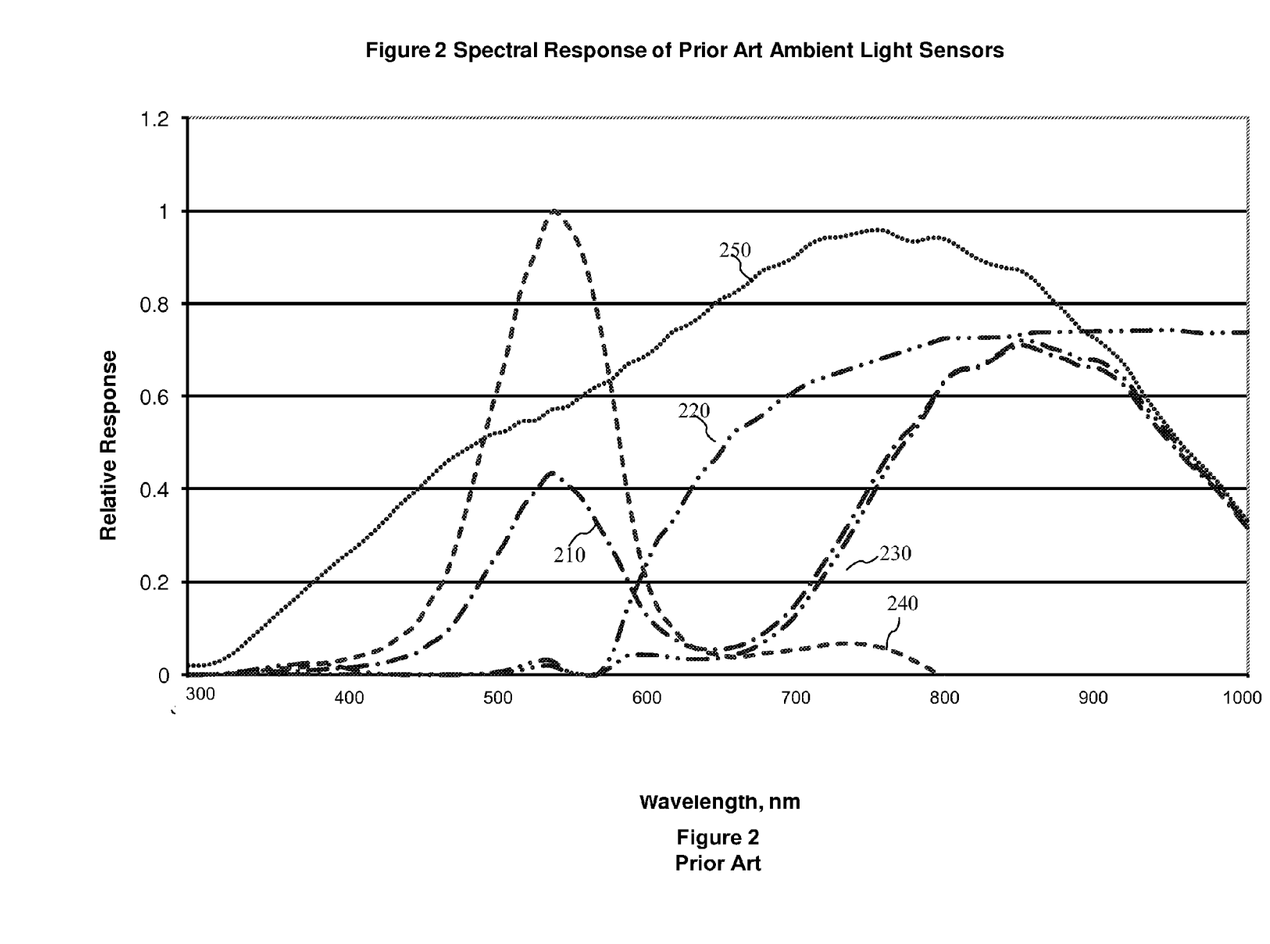
FIG. 2 is a general illustration of the ambient light response of the prior art photodiode array.

FIG. 2 illustrates exemplary responses of the green pixel response and red pixel response in prior art systems. A first plot 210 showing the green only sensor response is provided. A second plot 220 showing the red only response, a third plot 230 showing the green+red response, and a fourth plot 240 showing the green−K*(green+red) response is also provided, where K is a constant of proportionality. The unfiltered response of the photodiode is also provided in plot 250.

Figure 3:
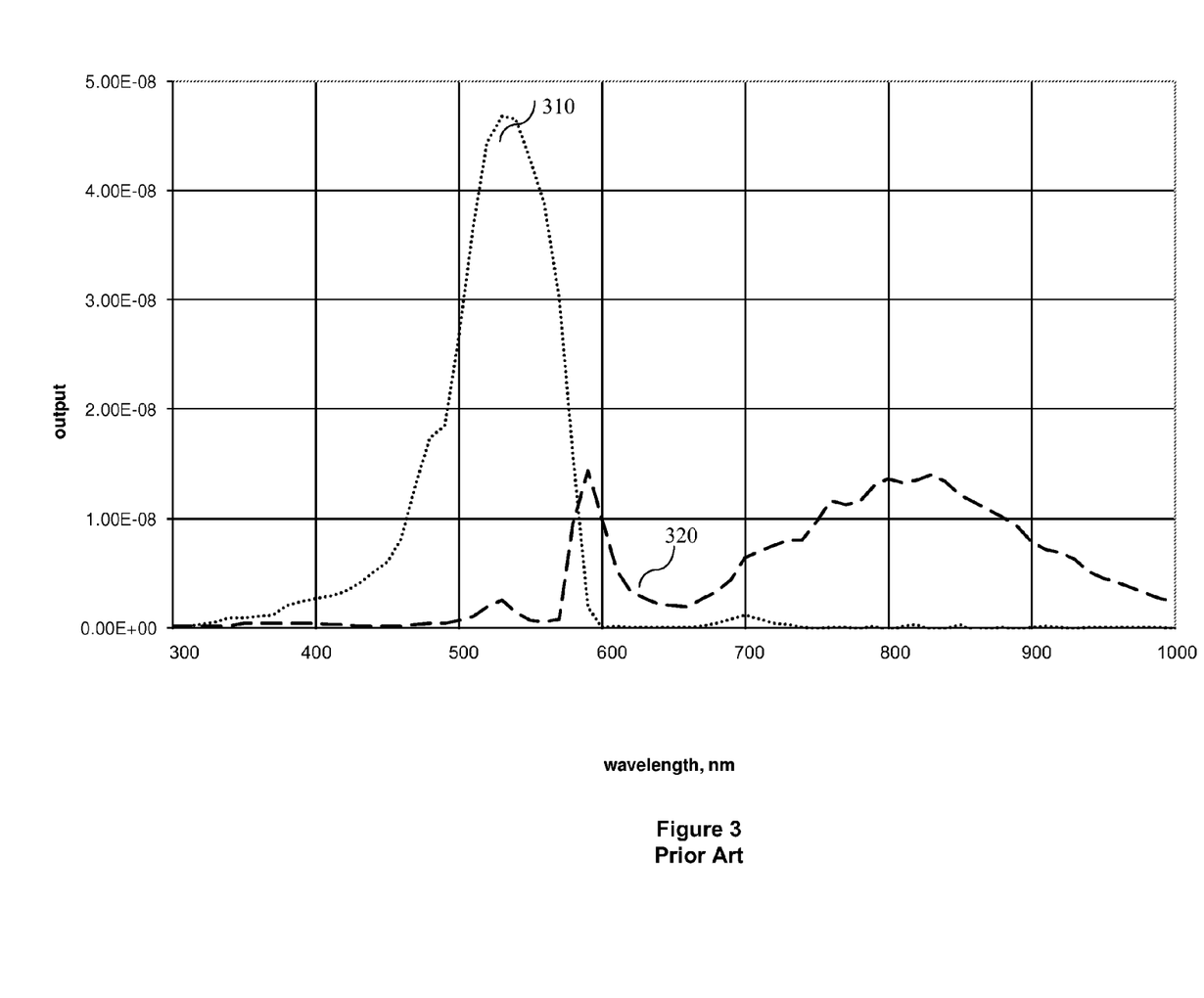
FIG. 3 is a general illustration of ambient light response and infrared response of the prior art photodiode array.

FIG. 3 shows the plot 310, the green−K*(green+red) response (which is the same as plot of 240), along with plot 320, which is the previously discussed CIE curve. One skilled in the art will recognize that the plot 310 obtained from processing the filtered signals from the photodiode provides a reasonably accurate representation of the CIE curve 320.

The plot 310 was obtained by executing the mathematical algorithm green−K*(green+red). Close observation of the green plot 210 and the K*(green+red) plot 230 reveal that in the infrared region between 700 nm and 1000 nm, the two plots match very well. That is why the resulting subtraction of these two signals, as exemplified by plot 310, has a small resulting response in the infrared wavelengths of interest. It is easily recognized that the accuracy of this subtraction is very much dependent upon obtaining the correct gain constant K, and also upon accurately performing the subtraction. Small errors in either the value of K, or in the subtraction operation, will result in large errors in the infrared response of the ambient light sensor. This sensitivity to errors is to a large extent a result of the fact that the two signals that are subtracted have large infrared sensitivities. The subtraction of two large numbers to obtain a small resultant is very sensitive to errors.

The same array of photodiodes shown in FIG. 1E is also used for the proximity detect function in prior art systems. It is evident from observing FIG. 2 that the signal of plot 230, the green+red signal, may be used for the proximity detect function. This signal has a broad peak response in the desired wavelengths of 850 nm and 940 nm, and has very little response in the visible wavelengths. Low sensitivity in the visible wavelengths is advantageous for a proximity detector in order to reduce false triggers from ambient visible light. Unfortunately, the robust response in the infrared wavelengths that is advantageous to the proximity detector function is at the same time disadvantageous to the ambient light sensor.

What is needed is an integrated light sensor and proximity detector in which the ambient light sensor has enhanced sensitivity to visible wavelengths and reduced sensitivity to infrared wavelengths and the proximity of detector has enhanced sensitivity to infrared wavelengths and reduced sensitivity to visible wavelengths.

SUMMARY OF THE INVENTION

Embodiments of the present invention provide systems, devices and methods for detecting both ambient light and proximity to an object. This detection is performed by a double-layered photodiode array and corresponding circuitry such that ambient light is derived using signals from a first set of photodiodes and a second set of photodiodes. In particular, ambient light is sensed by performing a mathematical operation on the signals from the two sets of photodiodes such that a spectral response is generated that closely approximates the CIE curve (visible light spectrum). Proximity detection is performed by measuring the amount of infrared light detected at a third photodiode located at a junction below the first and second sets of photodiodes.

Embodiments of the present invention provide various advantages over the prior art including, but not limited to, improved performance of the ambient light sensor due to the reduction of common-mode infrared detection. This reduction in common-mode infrared detection is a result of the third photodiode minimizing undesired photocurrent (from infrared radiation) migrating to the upper photodiode array. For example, when the photodiode array of the present invention performs ambient light sensing, the lower n-epi third photodiode is reverse biased between the power supply and ground and photocurrent collected in the lower photodiode is then shunted into the power supplies, and not into the measurement circuits. One skilled in the art will recognize that the junction depth of the lower photodiode can be placed at a depth preferred for collection of infrared radiation as described previously.

Although the subtraction scheme utilizing the G−(G+R) operation is effective in reducing the sensitivity to infra red radiation, the presence of the lower photodiode removes a substantially greater amount of the common mode infrared signal that would otherwise need to be subtracted. By reducing the magnitude of the common mode infrared signal, the requirements on the accuracy of the subtraction operation are relaxed. This improves yield, increases signal to noise ratio, and reduces sensitivity to process variations and other imperfections.

The performance of the proximity detector function is improved because the lower photodiode is situated at a junction depth that is preferred for the detection of infrared radiation. Whereas in the prior art, the infrared detection photodiodes were constrained to be at the same junction depth as the ambient sensing photodiodes. In embodiments of this invention, the junction depth of the infrared sensing photodiodes can be chosen independently of the ambient light sensing photodiodes. A further advantage is realized by two independent light sensing structures being stacked on top of each other, and can occupy the same space, thus conserving valuable chip area.

The photodiode array employs pixilated photodiodes that effectively shape the wavelength band being detected by the diodes. In certain embodiments, the first set of photodiodes is positioned under green filters and the second set of photodiodes is positioned under green and red filters. The photodiodes are positioned above an N-type epitaxial layer, which is located above a P-type substrate. The junction between the N-type epitaxial layer and the P-type substrate defines the infrared detecting junction diode.

Certain features and advantages of the present invention have been generally described in this summary section; however, additional features, advantages, and embodiments are presented herein or will be apparent to one of ordinary skill in the art in view of the drawings, specification, and claims hereof. Accordingly, it should be understood that the scope of the invention shall not be limited by the particular embodiments disclosed in this summary section.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. ("Fig.") 1A is an exemplary CIE photoptic curve known to one of skill in the art.

DETAILED DESCRIPTION OF THE PREFERRED EMBODIMENTS

Embodiments of the present invention provide systems, devices and methods for detecting both ambient light and proximity to an object. This detection is performed by a double-layered photodiode array and corresponding circuitry such that ambient light is derived using signals from a first set of photodiodes and a second set of photodiodes. In particular, ambient light is sensed by performing a mathematical operation on the signals from the two sets of photodiodes such that a spectral response is generated that closely approximates the CIE curve (visible light spectrum). Proximity detection is performed by measuring the amount of infrared light detected at a third photodiode located at a junction below the first and second sets of photodiodes.

In the following description, for the purpose of explanation, specific details are set forth in order to provide an understanding of the invention. It will be apparent, however, to one skilled in the art that the invention may be practiced without selected of these details. One skilled in the art will recognize that embodiments of the present invention, some of which are described below, may advantageously be incorporated into a number of different devices and systems. Structures and devices shown in block diagram are illustrative of exemplary embodiments of the invention and are included to avoid obscuring the invention. Furthermore, connections between components within the figures are not intended to be limited to direct connections. Rather, such connections components may be modified, reconfigured, or otherwise changed by intermediary components.

Reference herein to "one embodiment" or "an embodiment" of the invention means that a particular feature, structure, characteristic, or function described in connection with the embodiment is included in at least one embodiment of the invention. The use of the phrase "in one embodiment" at various locations in the specification are not necessarily all references to a single embodiment of the invention.

Figure 4A:
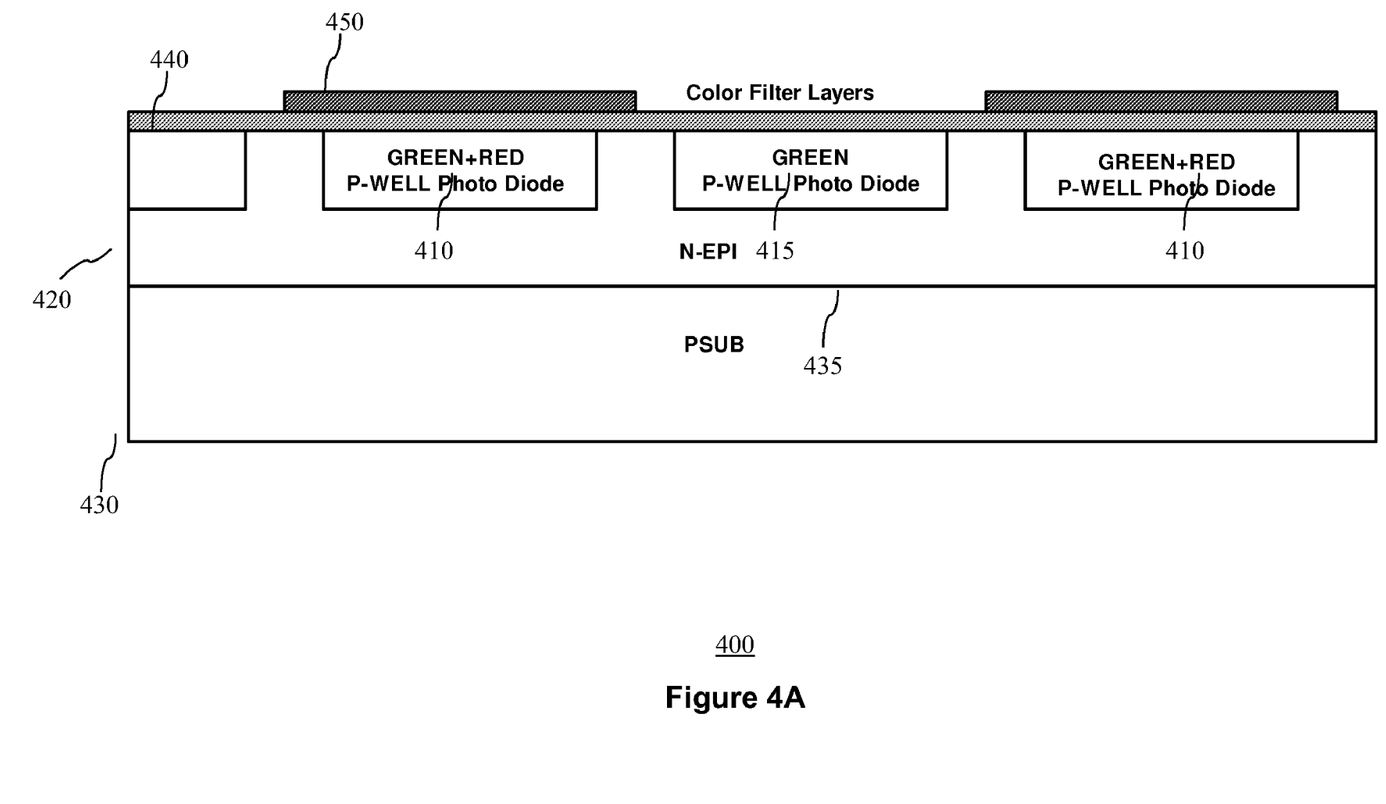
FIG. 4A is an illustration of a double-layered photodiode array for ambient light sensing and infrared sensing according to various embodiments of the invention.

FIG. 4 illustrates a double-layered photodiode array according to various embodiments of the invention. The photodiode array comprises a plurality of pixilated P-well photodiodes 410, 415 positioned within and/or above an N-type epitaxial layer 420. The pixilation on the photodiodes 410, 415 is achieved by placing a first color filter across each of the photodiodes 410 and placing a second color filter, on top of the first color filter, above a subset of the photodiodes. The result of this pixilation is that a first set of photodiodes 415, only having the first color filter, has a response to a first wavelength band and a second set of photodiodes 410, having both the first and second color filters, has a response to a second wavelength band. In certain embodiments of the invention, the first color filter is a green filter and the second color filter is a red filter.

The N-type epitaxial layer 420 is grown above a P-type substrate such that a junction 435 between the two layers functions as an infrared sensing diode for proximity detection. This junction 435 significantly improves the sensitivity of the infrared sensing functionality of the device.

Figure 4B:
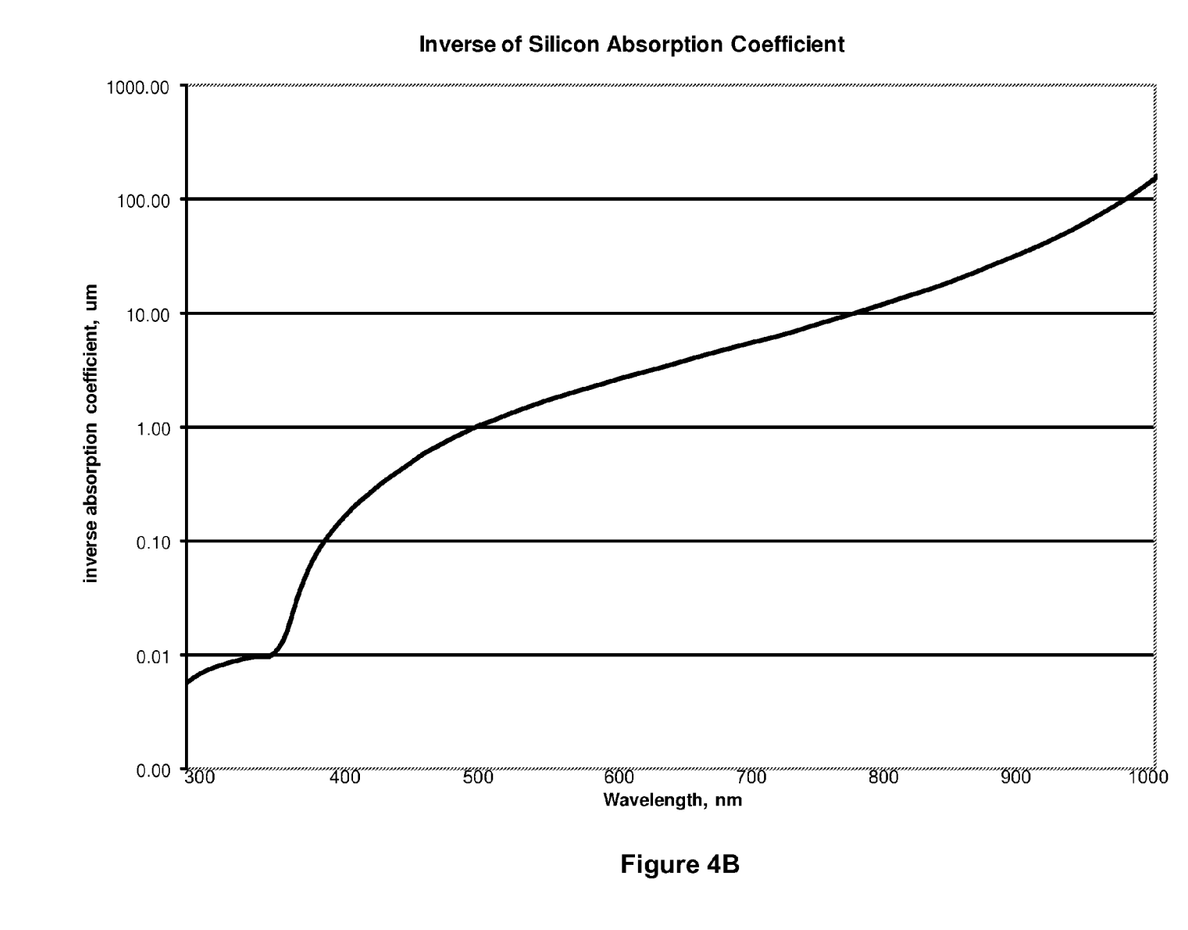
FIG. 4B is an plot illustrating the inverse of the silicon absorption coefficient.

One skilled in the art will recognize that the variation in absorption depth of electromagnetic radiation is a function of wavelength. Absorption depth is defined as the depth at which radiation has dropped to 1/e or 37% of the magnitude that penetrates the surface. Conversely, it is also the depth at which 63% of the radiation has been absorbed, and converted to photo current. Placing the junction at that depth improves the probability that the generated photocurrent will be collected by the photodiode rather than be lost to recombination or other loss mechanisms. FIG. 4B shows the inverse absorption coefficient for silicon as a function of wavelength. In one embodiment, a preferred junction depth for collection of photoelectrons is greater than 10 um for wavelengths in the infrared wavelengths of 850 and 940 nm.

The deep penetration of these longer wavelengths favors the selection of deeper photodiode junctions for the proximity detector. One skilled in the art will recognize that the double-layered photodiode array may be manufactured using various processes in which a plurality of surface photodiodes are positioned above an infrared detecting diode within the surface. In certain embodiments, an epitaxial layer is provided to effectively create depth between the surface photodiodes and the infrared detecting diode. In other embodiments, a double diffusion process may also be implemented in which a layer is positioned below the surface photodiodes and forms a photodiode structure at the junction between the layer and the substrate. These two manufacturing methods should be considered examples and not place any limit to the method in which depth is provided between the surface photodiodes and the infrared detecting diode.

The junction 435 between the N-epi and P-sub results in a significantly larger sensitivity in detecting infrared because of the enhancement of the junction's detecting ability due to its increased depth below the semiconductor surface. The junction also improves ambient light detection due to a reduction in the amount of common-mode infrared detection, relative to the prior art systems, across the photodiode array. This reduction in common-mode infrared detection is a result of the longer wavelengths penetrating deeply into the substrate and being detected (i.e., electron-hole pairs are created deeper within the substrate of the device and migrating back to the photodiodes). This reduction in common-mode infrared detection also results in the enhanced detection within the device by decreasing the effects of common-mode infrared cancellation (i.e., subtraction) within the mathematical derivation of the response.

One skilled in the art will recognize that the depth of the junction 435 may vary.

Figure 5:
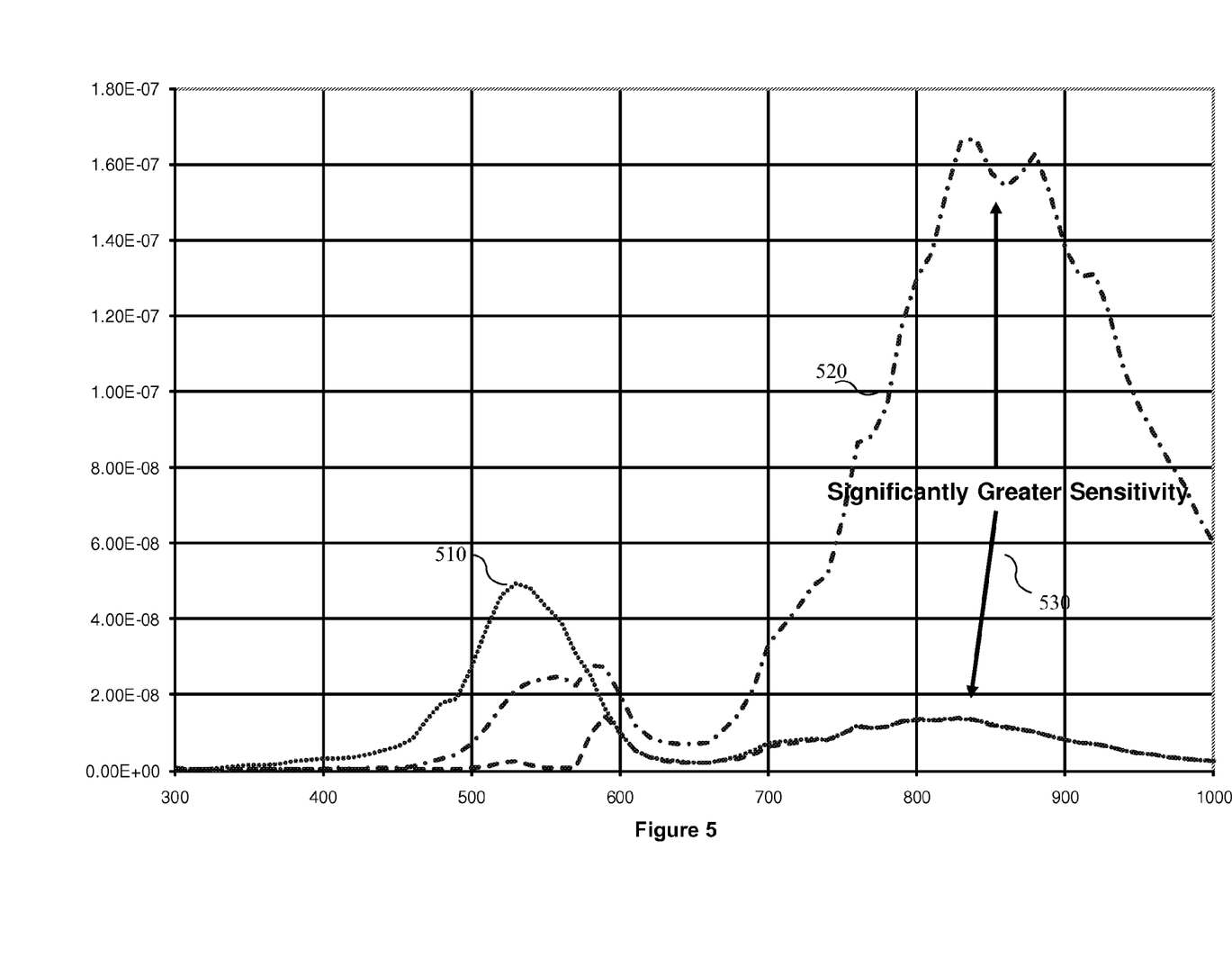
FIG. 5 is an exemplary plot showing both the ambient light sensing response and the infrared sensing response of the double-layered photodiode array in accordance with various embodiments of the invention.

An example of the improvement obtained by this invention is shown in FIG. 5. Curve 510 shows the relative spectral response measured from the ambient light sensing pixels 415 that are covered with the green filter. Curve 540 shows the relative spectral response from the pixels 410 that are covered with the green plus red filter. Curve 520 shows the relative spectral response of the lower photodiode 435 used for the proximity detector. The dramatic improvement in the infrared sensitivity of the deeper photodiode junction used for the proximity detector is evident. The reduction in the common mode infrared signal 540 is also evident.

One skilled in the art will recognize that the high sensitivity infrared response and improved ambient light response may be applied to handsets and mobile devices in which management of power is important. Additionally, many of these mobile devices include darker glass or smoked glass over the display that further attenuates light within the visible light spectrum but does not meaningfully degrade infrared light. In such scenarios, maintaining common mode infrared detected light at a minimum becomes even more important.

Figure 6:
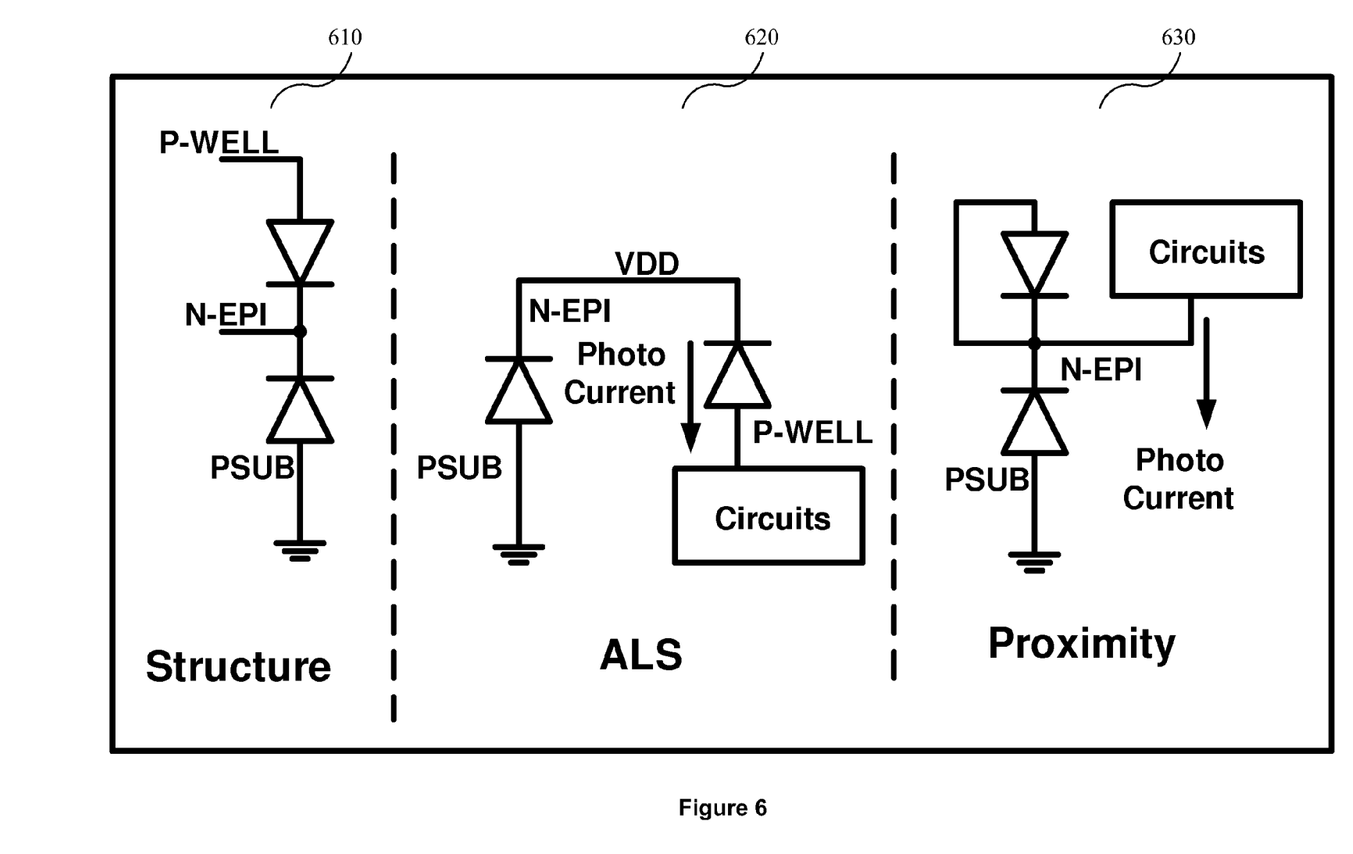
FIG. 6 is a structural representation of an integrated ambient light sensor and a proximity detector according to various embodiments of the invention.

FIG. 6 is a structural representation of a dual-layered photodiode device for ambient light and proximity detection according to various embodiments of the invention. In this illustration, the structure of the semiconductor device is shown in a first section 610. A second portion 620 represents the ambient light sensor and a third portion 630 represents a proximity detector.

Embodiments of this invention operate with two different circuit connections for two operating modes, ambient light sensing and proximity detection as shown in FIG. 6. The first section 610 shows the circuit diagram representing the physical structure of FIG. 4. The anode of the lower n-epi photodiode 611 is always connected to ground, and the cathode of lower photodiode 611 is connected to the cathode of upper photodiode 612, where it is understood that photodiode 612 is, in general, a multiplicity of pixilated photodiodes. The anode of photodiode(s) 612 is labeled p-well.

The second section 620 illustrates how the circuitry connects the two photodiode structures for ambient light sensing. The node which is common to the cathode of the lower photodiode 611 and the cathode of photodiode(s) 612 is connected by a circuit elements to the power supply, or any other low impedance voltage source. The measurement circuitry is connected to the anode of the upper photodiode(s).

The third section 630 illustrates how the circuitry connects the photodiodes for proximity sensing. The p-well photodiode(s) 612 are self-shorted, and the measurement circuits are connected to the cathode of the lower n-epi photodiode 611.

One skilled in the art will recognize that various semiconductor manufacturing processes may be employed to build the semiconductor device. For example, BiCMOS processes, combined with circuit topology process, may be employed to create the stacked photodiode structure.

Figure 7:
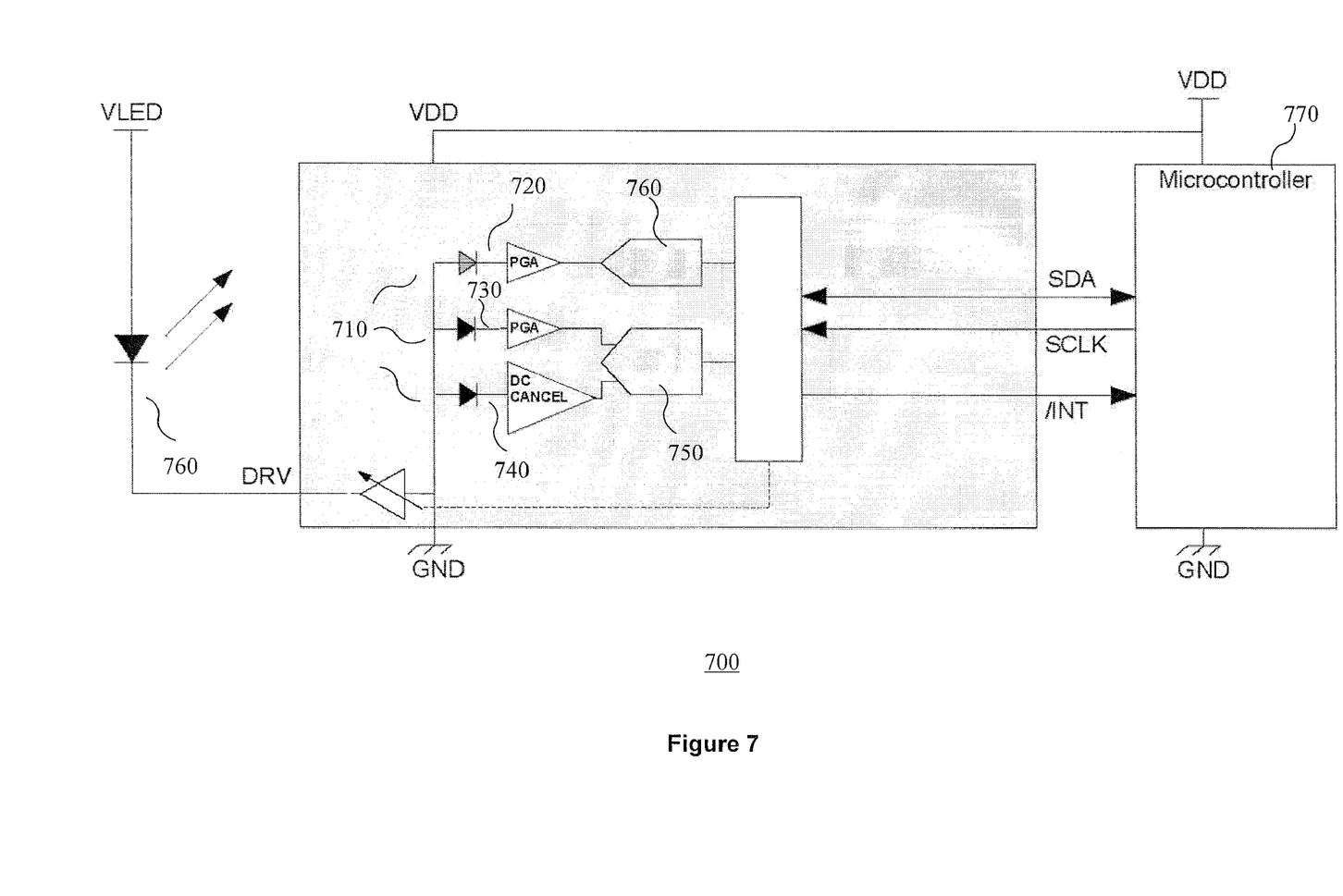
FIG. 7 is an illustration of a double-layered photodiode array and corresponding circuitry for ambient light and proximity sensing according to various embodiments of the invention.

FIG. 7 is an illustration of the photodiode array with corresponding circuitry according to various embodiments of the invention. In this figure, signals 710 from the photodiode are provided to the circuit such that a first signal 720 responsive to both the visual light spectrum and infrared spectrum is provided to a first analog-to-digital converter 760. A second signal 730 responsive to only the visual light spectrum is provided to a second analog-to-digital converter 750. A third signal 740 relating to the response of the junction diode 435 is provided to the analog-to-digital converter. The mathematical process to derive the infrared response is subsequently performed in the digital domain. A microcontroller 770 is provided for later processing of this information.

Figure 8:
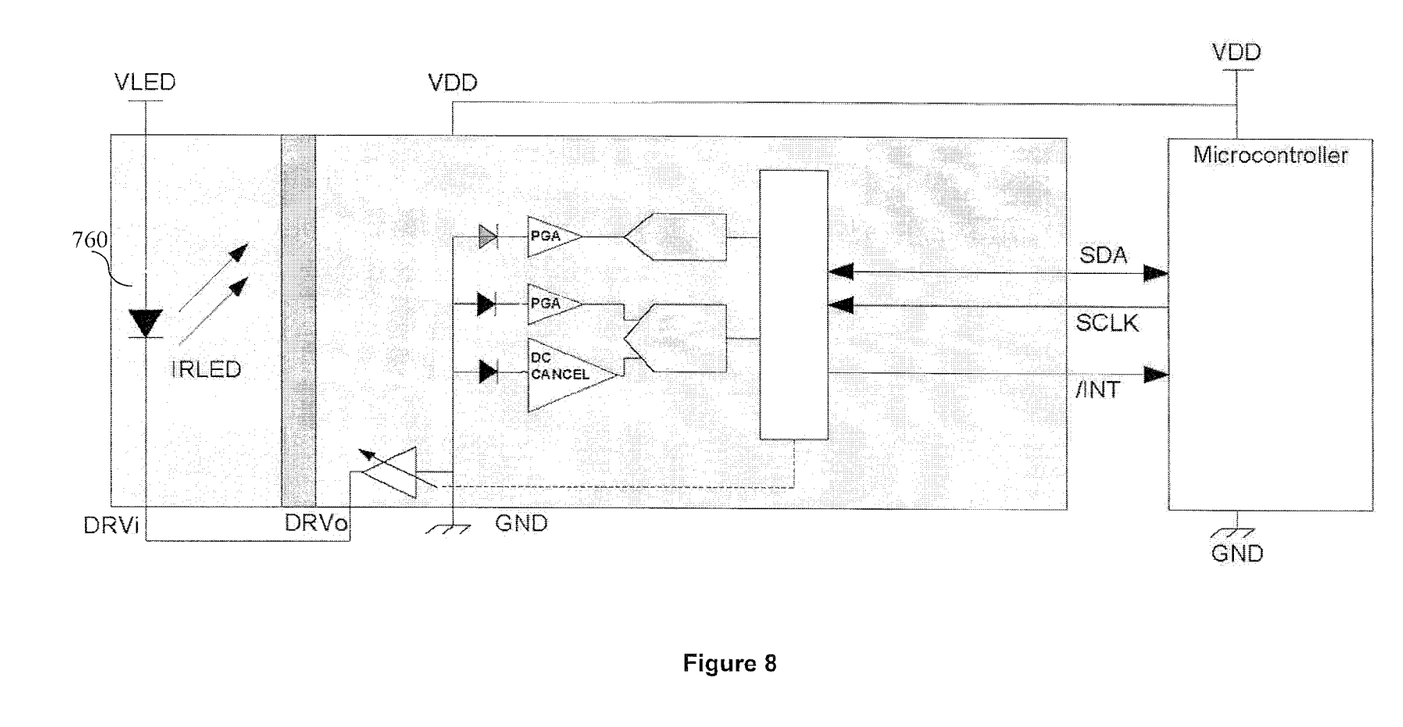
FIG. 8 is an illustration of an integrated double-layered photodiode array and corresponding circuitry for ambient light and proximity sensing according to various embodiments of the invention.

In this particular embodiment, an infrared LED emitter 760 is separate from the detector device. In other embodiments, the infrared LED emitter 760 is integrated with the detector as shown in FIG. 8.

The foregoing description of the invention has been described for purposes of clarity and understanding. It is not intended to limit the invention to the precise form disclosed. Various modifications may be possible within the scope and equivalence of the appended claims.

I claim:

1. A multi-layered photodiode array comprising:
    a substrate;
    an first layer located directly above the substrate;
    a first photodiode, integrated on the first layer, the first photodiode generates a first response to a first wavelength band;
    a second photodiode, integrated on the first layer, the second photodiode generates a second response to a second wavelength band;
    a third photodiode, located at a junction between the substrate and the first layer, the third photodiode generating a third response to an infrared wavelength band from which a proximity detection measurement is performed; and
    wherein ambient light is sensed by mathematically processing the first and second responses such that a spectral response associated with a visible light spectrum is generated.

2. The photodiode array of claim 1 wherein the first and second photodiodes are pixilated.

3. The photodiode array of claim 2 wherein a green filter and a red filter are positioned above the first photodiode.

4. The photodiode array of claim 2 wherein only a green filter is positioned above the second photodiode.

5. The photodiode array of claim 4 wherein an ambient light spectral response is generated by subtracting the second response from the first response.

6. The photodiode array of claim 1 wherein the first layer is an epitaxial layer.

7. The photodiode array of claim 6 wherein the epitaxial layer is an N-type epitaxial layer.

8. The photodiode array of claim 1 wherein the first layer is created by a double diffusion process.

9. The photodiode array of claim 1 wherein the first wavelength band is centered approximately around 550 nm.

10. The photodiode array of claim 1 wherein the substrate is a P-type substrate.

11. A method for sensing ambient light and detecting proximity, the method comprising:
    generating a first response by sensing light within a visible light spectrum at a first photodiode;
    generating a second response by sensing light within the visible light spectrum and an infrared spectrum at a second photodiode;

generating a third response by sensing infrared light at a third photodiode located at a depth below the first and second photodiodes;
determining an ambient light intensity by mathematically processing the first and second responses; and
measuring a proximity distance using the third response.

12. The method of claim 11 wherein the first and second photodiodes are pixilated.

13. The method of claim 12 wherein a green filter and a red filter are positioned above the first photodiode.

14. The method of claim 12 wherein only a green filter is positioned above the second photodiode.

15. The method of claim 14 wherein the step of determining an ambient light intensity is generated by subtracting the second response from the first response.

16. A system for sensing ambient light and detecting proximity, the system comprising:
a photodiode array comprising:
a substrate;
an first layer located directly above the substrate;
a first photodiode, integrated on the first layer, the first photodiode generates a first response to a first wavelength band associated with ambient light sensing;
a second photodiode, integrated on the first layer, the second photodiode generates a second response to a second wavelength band;
a third photodiode, located at a junction between the substrate and the first layer, the junction diode generating a third response to an infrared wavelength band;
computational logic coupled to receive the first, second and third responses and generate an intensity measurement of ambient light and derive a proximity calculation; and
an infrared emitter that generates a pulsed infrared signal.

17. The system of claim 16 wherein the photodiode array and the computational logic are integrated within a single semiconductor device.

18. The system of claim 16 wherein the photodiode array, the computational logic and the infrared emitter are integrated within a single semiconductor device.

19. The system of claim 16 wherein the system is located within a mobile device.

20. The system of claim 19 wherein the mobile device comprises dark glass positioned over a display.

* * * * *